(12) United States Patent
Farris, III

(10) Patent No.: US 7,939,454 B1
(45) Date of Patent: May 10, 2011

(54) MODULE AND LAMINATION PROCESS FOR MULTIJUNCTION CELLS

(75) Inventor: Chester A. Farris, III, Yorba Linda, CA (US)

(73) Assignee: Stion Corporation, San Jose, CA (US)

( * ) Notice: Subject to any disclaimer, the term of this patent is extended or adjusted under 35 U.S.C. 154(b) by 107 days.

(21) Appl. No.: 12/406,317

(22) Filed: Mar. 18, 2009

Related U.S. Application Data

(60) Provisional application No. 61/057,825, filed on May 31, 2008.

(51) Int. Cl.
*H01L 21/302* (2006.01)
*H01L 21/461* (2006.01)

(52) U.S. Cl. ........ 438/753; 438/311; 438/603; 438/604; 257/E21.007; 257/E21.082; 257/E21.115; 257/E21.138; 257/E21.285; 257/E21.286; 257/E21.289; 257/E21.32

(58) Field of Classification Search .................. 438/753, 438/311, 93, 95, 602, 603, 604, 780; 257/E21.007, 257/82, 115, 138, 285, 286, 289, 32
See application file for complete search history.

(56) References Cited

U.S. PATENT DOCUMENTS

| | | |
|---|---|---|
| 4,335,266 A | 6/1982 | Mickelsen et al. |
| 4,441,113 A | 4/1984 | Madan |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,532,372 A | 7/1985 | Nath et al. |
| 4,542,255 A | 9/1985 | Tanner et al. |

(Continued)

FOREIGN PATENT DOCUMENTS

AU 734676 2/1999

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

*Primary Examiner* — David Nhu
(74) *Attorney, Agent, or Firm* — Kilpatrick Townsend & Stockton LLP

(57) ABSTRACT

A method for packaging solar cell module. The method includes providing a first substrate member and forming a plurality of thin film photovoltaic cells overlying the surface region of the first substrate member. A first connector member and a second connector member having a second thickness are operably coupled to each of the plurality of thin film photovoltaic cells. A first spacer element and a second spacer element overly portions of the surface region of the first substrate member. The method provides a laminating material overlying the plurality of thin film photovoltaic cells, the spacer elements, and the connector members. A second substrate member overlies the laminating material. A lamination process is performed to form the solar cell module by maintaining a spatial gap occupied by the laminating material between an upper surface regions of the connector members and the second substrate member using the spacer elements. A planarity between the first substrate member and the second substrate member is maintained during the lamination process.

19 Claims, 5 Drawing Sheets

U.S. PATENT DOCUMENTS

| | | | |
|---|---|---|---|
| 4,581,108 A | 4/1986 | Kapur et al. | |
| 4,589,194 A | 5/1986 | Roy | |
| 4,589,918 A | 5/1986 | Nishida | |
| 4,598,306 A | 7/1986 | Nath et al. | |
| 4,599,154 A | 7/1986 | Bender et al. | |
| 4,611,091 A | 9/1986 | Choudary et al. | |
| 4,612,411 A | 9/1986 | Wieting et al. | |
| 4,623,601 A | 11/1986 | Lewis et al. | |
| 4,625,070 A | 11/1986 | Berman et al. | |
| 4,638,111 A | 1/1987 | Gay | |
| 4,661,370 A | 4/1987 | Tarrant | |
| 4,663,495 A | 5/1987 | Berman et al. | |
| 4,724,011 A | 2/1988 | Turner et al. | |
| 4,751,149 A | 6/1988 | Vijayakumar et al. | |
| 4,775,425 A | 10/1988 | Guha et al. | |
| 4,798,660 A | 1/1989 | Emer et al. | |
| 4,816,082 A | 3/1989 | Guha et al. | |
| 4,914,042 A | 4/1990 | Mahan | |
| 4,915,745 A | 4/1990 | Pollock et al. | |
| 4,950,615 A | 8/1990 | Basol et al. | |
| 4,996,108 A | 2/1991 | Divigalpitiya et al. | |
| 5,008,062 A | 4/1991 | Anderson et al. | |
| 5,028,274 A | 7/1991 | Basol et al. | |
| 5,029,760 A | 7/1991 | Gamblin | |
| 5,039,353 A | 8/1991 | Schmitt | |
| 5,045,409 A | 9/1991 | Eberspacher et al. | |
| 5,069,868 A | 12/1991 | Tokiai et al. | |
| 5,078,803 A | 1/1992 | Pier et al. | |
| 5,125,984 A | 6/1992 | Kruehler et al. | |
| 5,133,809 A | 7/1992 | Sichanugrist et al. | |
| 5,137,835 A | 8/1992 | Karg | |
| 5,180,686 A | 1/1993 | Banerjee et al. | |
| 5,211,824 A | 5/1993 | Knapp | |
| 5,231,047 A | 7/1993 | Oyshinsky et al. | |
| 5,248,345 A | 9/1993 | Sichanugrist et al. | |
| 5,261,968 A | 11/1993 | Jordan | |
| 5,298,086 A | 3/1994 | Guha et al. | |
| 5,336,623 A | 8/1994 | Sichanugrist et al. | |
| 5,346,853 A | 9/1994 | Guha et al. | |
| 5,474,939 A * | 12/1995 | Pollock et al. | 438/85 |
| 5,501,744 A | 3/1996 | Albright et al. | |
| 5,512,107 A | 4/1996 | Van den Berg | |
| 5,536,333 A | 7/1996 | Foote et al. | |
| 5,665,175 A | 9/1997 | Safir | |
| 5,977,476 A | 11/1999 | Guha et al. | |
| 6,166,319 A | 12/2000 | Matsuyama | |
| 6,288,415 B1 | 9/2001 | Leong et al. | |
| 6,294,274 B1 | 9/2001 | Kawazoe | |
| 6,328,871 B1 | 12/2001 | Ding et al. | |
| 6,784,492 B1 | 8/2004 | Morishita et al. | |
| 6,852,920 B2 | 2/2005 | Sager et al. | |
| 6,878,871 B2 | 4/2005 | Scher et al. | |
| 7,180,101 B2 | 2/2007 | Ouichi | |
| 7,265,047 B2 | 9/2007 | Lee | |
| 2002/0063065 A1 | 5/2002 | Sonoda | |
| 2003/0075717 A1 | 4/2003 | Kondo et al. | |
| 2004/0063320 A1 | 4/2004 | Hollars | |
| 2004/0095658 A1 | 5/2004 | Buretea et al. | |
| 2004/0110393 A1 | 6/2004 | Munzer et al. | |
| 2004/0203220 A1 | 10/2004 | Morooka et al. | |
| 2004/0244826 A1 | 12/2004 | Takagi | |
| 2004/0245912 A1 | 12/2004 | Thurk et al. | |
| 2004/0252488 A1 | 12/2004 | Thurk | |
| 2005/0164432 A1 | 7/2005 | Lieber et al. | |
| 2005/0287717 A1 | 12/2005 | Heald et al. | |
| 2006/0002838 A1 | 1/2006 | Oda | |
| 2006/0003585 A1 | 1/2006 | Morooka | |
| 2006/0034065 A1 | 2/2006 | Thurk | |
| 2006/0040103 A1 | 2/2006 | Whiteford et al. | |
| 2006/0051505 A1 | 3/2006 | Kortshagen et al. | |
| 2006/0053969 A1 | 3/2006 | Harada | |
| 2006/0220059 A1 | 10/2006 | Satoh et al. | |
| 2007/0006914 A1 | 1/2007 | Lee | |
| 2007/0089782 A1 | 4/2007 | Scheuten et al. | |
| 2007/0151596 A1 | 7/2007 | Nasuno et al. | |
| 2007/0169810 A1 | 7/2007 | Van Duren et al. | |
| 2008/0041446 A1 | 2/2008 | Wu et al. | |
| 2009/0260675 A1 * | 10/2009 | Erdemli et al. | 136/251 |

FOREIGN PATENT DOCUMENTS

| | | |
|---|---|---|
| DE | 3314197 A1 | 11/1983 |
| DE | 10104726 A1 | 8/2002 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2004/332043 | 11/2004 |
| JP | 2005/311292 | 11/2005 |
| WO | WO 2005011002 | 2/2005 |

OTHER PUBLICATIONS

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of ZnxCd1−xS Nanocomposites in Polymer Matrices and their Photophysical Properties, Langmuir 1998, 14, pp. 4342-4344.

International Search Report and Written Opinion of PCT Application No. PCT/US08/76908, date of mailing Dec. 1, 2008, 8 pages total.

International Search Report and Written Opinion of PCT Application No. PCT/US2008/078001, date of mailing Dec. 2, 2008, 7 pages total.

International Search Report and Written Opinion of PCT Application No. PCT/US08/78019, date of mailing Dec. 8, 2008, 9 pages total.

International Search Report and Written Opinion of PCT Application No. PCT/US08/77965, date of mailing Dec. 9, 2008, 8 pages total.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Yang et al., Fabrication and Characteristics of ZnS Nanocrystals/Polymer Composite Doped with Tetraphenylbenzidine Single Layer Structure Light-emitting Diode, Applied Physics Lett. vol. 69 (3), Jul. 15, 1996, pp. 377-379.

Yang et al., Preparation, Characterization and Electroluminescence of ZnS Nanocrystals in a Polymer Matrix, J. Mater. Chem., 1997, 7(1), pp. 131-133.

Yang et al., Electroluminescence from ZnS/CdS Nanocrystals/Polymer Composite, Synthetic Metals 91, (1997) 347-349.

* cited by examiner

MODULE AND LAMINATION PROCESS FOR MULTIJUNCTION CELLS

CROSS-REFERENCES TO RELATED APPLICATIONS

This application claims priority to U.S. Provisional Patent Application No. 60/057,825, 61/057,825, filed May 31, 2008, entitled "MODULE AND LAMINATION PROCESS FOR MULTIJUNCTION CELLS" by inventor CHESTER A. FARRIS, III, commonly assigned and incorporated by reference herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to method of packaging photovoltaic cells. More particularly, the present invention provides a method for manufacture of a solar module. Merely by way of example, the present method and structure have been implemented using a laminating process, but it would be recognized that the invention may use other processes.

From the beginning of time, human beings have been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles Calif. Other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. These and other limitations of these conventional technologies can be found throughout the present specification and more particularly below.

From the above, it is seen that improved techniques for manufacturing photovoltaic cells and resulting devices are desired.

BRIEF SUMMARY OF THE INVENTION

According to embodiments of the present invention, techniques directed to solar cell modules are provided. More particularly, embodiments according to the present invention provide a method and a structure for packaging photovoltaic cells into solar cell modules. But it would be recognized that the present invention has a broader range of applicability.

In a specific embodiment, a method for packaging solar cell module is provided. The method includes providing a first substrate member having a surface region. The method forms a plurality of thin film photovoltaic cells overlying the surface region of the first substrate member. Each of the thin film photovoltaic cell is characterized by a first thickness, a first width, and a first length. The method operably couples a first connector member and a second connector member to each of the plurality of thin film photovoltaic cells. The first connector member and the second connector member each has a upper surface region and a second thickness. The method includes providing a first spacer element overlying a first portion of the surface region of the first substrate member, a second spacer element overlying a second portion of the surface region of the first substrate member. The first spacer element and the second spacer element each has a third thickness. In a specific embodiment, the method provides a laminating material overlying the plurality of thin film photovoltaic cells, the spacer element, the second spacer element, the first connector member, the second connector member, and exposed regions of the first substrate member. The method then couples a second substrate member overlying the laminating material and processes the first substrate member, the laminating material, and the second substrate member using a lamination process to form a photovoltaic module. In a specific embodiment, the method includes maintaining a spatial gap occupied by a portion of the laminating material between the upper surface region and the second substrate member. The first spacer element and the second spacer element are used to maintain planarity between the first substrate member and the second substrate member during the lamination process in a specific embodiment.

Many benefits are achieved by way of the present invention. For example, embodiments according to the present invention uses materials and components that are commercially available to form a solar cell module. In a specific embodiment, the present method uses connector members to form spacer elements to maintain planarity of the substrate members during a laminating process. Depending on the embodiment, one or more of the benefits can be achieved. These and other benefits will be described in more detail throughout the present specification and particularly below.

Various additional objects, features and advantages of the present invention can be more fully appreciated with reference to the detailed description and accompanying drawings that follow.

DETAILED DESCRIPTION OF THE INVENTION

According to embodiments of the present invention, a method for manufacture of a solar cell module is provided. More particularly, embodiment according to the present invention provide a solar cell module with improved connector reliability. But it would be recognized that the present invention has a much broader range of applicability.

Figure 1:
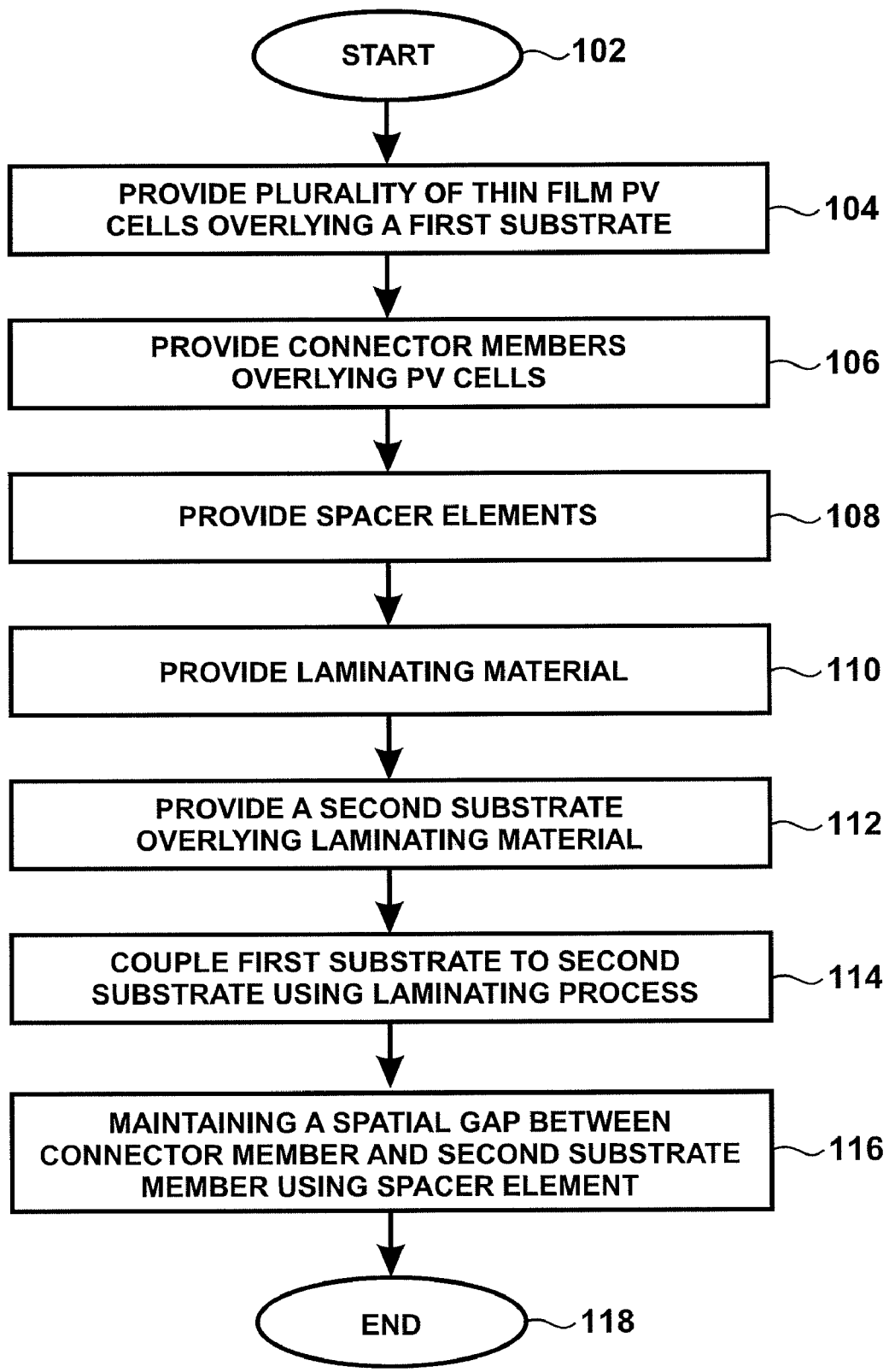
FIG. 1 is a simplified flow diagram illustrating a method for assembling thin film photovoltaic cell module according to an embodiment of the present invention.

FIG. 1 is a simplified flow diagram 100 illustrating a method of assembling a thin film photovoltaic cell module according to an embodiment of the present invention. As shown in FIG. 1, the method includes a start step (Step 102). The method includes forming a plurality of photovoltaic cells overlying a first substrate member (Step 104). In a specific embodiment, the plurality of photovoltaic cells are fabricated using semiconductor metal chalcogenide materials. In a specific embodiment, the first substrate member can be a transparent substrate such as glass, quartz, fused silica, and others. A connector member is formed overlying the plurality of the photovoltaic cells (Step 106). The connector member can be a ribbon connector in a specific embodiment. In a specific embodiment, the method includes providing spacer elements overlying portions of the first substrate member (Step 108). A laminating material is provided overlying at least the connector member and the plurality of photovoltaic cells (Step 110). The laminating material can be ethyl vinyl acetate (EVA) in a specific embodiment. The method provides a second substrate member (for example a glass substrate) overlying the laminating material (Step 112). The first substrate, the laminating material, and the second substrate are subjected to a laminating process to maintain a planarity of the first substrate member and the second member and to form a photovoltaic module (Step 114). In a specific embodiment, a spatial gap is provided on an upper surface region of the connector member and the second substrate member (Step 116). The method includes an end step (Step 118).

The above sequence of steps provides a method for packaging a solar cell module according to an embodiment of the present invention. The method uses a combination of steps including a way to couple substrate members to package photovoltaic cells for fabricating a photovoltaic module using a laminating process. Other alternatives can also be provided where one or more steps may be added, one or more steps may be removed, or one or more steps may be performed in a different sequence without departing form the scope of the claims herein. Further details of the present method can be found throughout the present specification and more particularly below.

Figure 2:
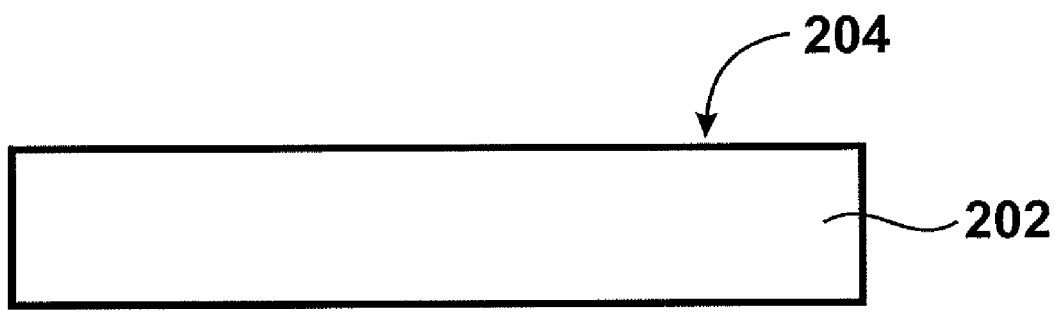
FIGS. 2-9 are simplified diagrams illustrating a method for packaging thin film photovoltaic cells into a solar cell module according to an embodiment of the present invention.

FIGS. 2-9 are simplified diagrams illustrating a method of packaging a solar cell module according to an embodiment of the present invention. These diagrams are merely examples and should not unduly limit the claims herein. One skilled in the art would recognize other variations, modifications, and alternatives. As shown in FIG. 2, the method provides a first substrate member 202 including a surface region 204. The substrate member can be made of an insulator material, a conductor material, or a semiconductor material, depending on the application. In a specific embodiment, the conductor material can be nickel, molybdenum, aluminum, or a metal alloy such as stainless steel and the likes. In a specific embodiment, the semiconductor material may include silicon, germanium, silicon germanium, compound semiconductor material such as III-V materials, II-VI materials, and others. In a specific embodiment, the insulator material can be a transparent material such as glass, quartz, fused silica, and the like. Alternatively, the insulator material can be a polymer material, a ceramic material, or a layer material or a composite material depending on the application. The polymer material may include acrylic material, polycarbonate material, and others, depending on the embodiment. The first substrate member is preferably a transparent substrate such as glass, fused silica or quartz. Of course, there can be other variations modifications, and alternatives.

Figure 3:
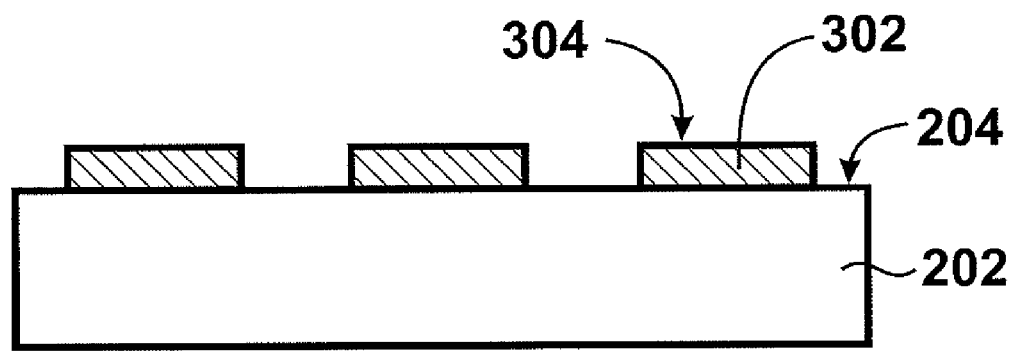

Referring to FIG. 3, the method includes forming a plurality of thin film photovoltaic cells 302 overlying the surface region of the first substrate member. Each of the plurality photovoltaic cell includes a top region 304. In a specific embodiment, the plurality of thin film photovoltaic cells are formed using semiconductor metal chalcogenide thin film materials. Examples of the semiconductor metal chalcogenide thin film can include semiconductor metal oxides, semiconductor metal sulfides, semiconductor metal tellurides, semiconductor metal selenides, and others. Such thin film photovoltaic cells have been described in detailed in U.S. Patent Application No. 60/988,099 filed Nov. 14, 2007 as well as in U.S. Patent Application No. 60/976,391 filed Sep. 28, 2007, commonly assigned, and hereby incorporate for reference for all purposes.

Figure 4:
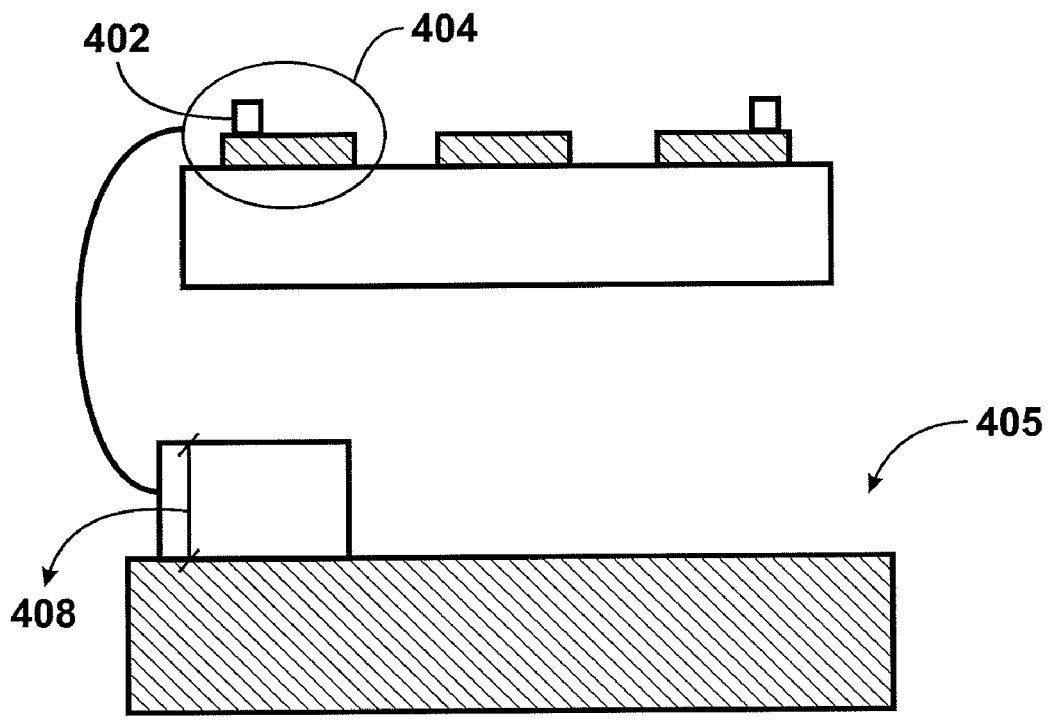

In a specific embodiment, the method includes coupling a first connector member 402 and a second connector member 404 to a selected plurality of thin film photovoltaic cells as shown in FIG. 4. The first connector member and the second connector member provide electrical connection between the selected thin film photovoltaic cells for the solar cell module in a specific embodiment. As shown in an expanded view 405, the first connector member and the second connector member each includes a first upper surface region 406 and a second thickness 408. The first connector member and the second connector member can be ribbon connectors in a specific embodiment. Other types of suitable connector member can also be used depending on the embodiment. Each of the connector member can have a thickness of about four mil to about six mils in certain embodiments. Of course there can be other variations, modifications, and alternatives.

Figure 5:
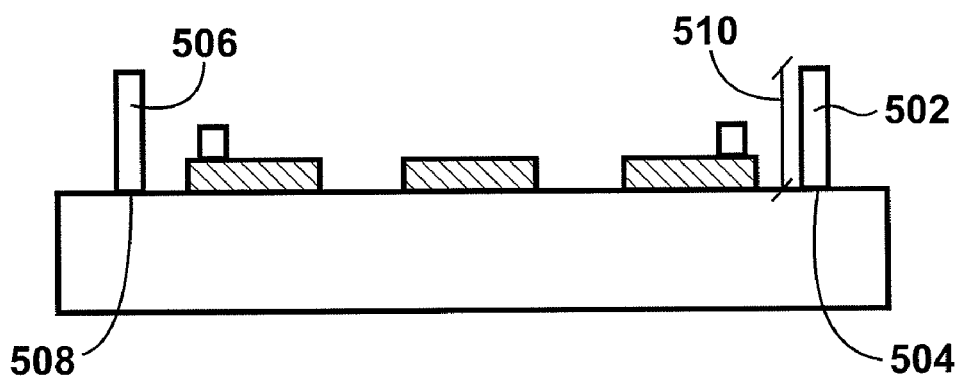

In a specific embodiment, the method provides a first spacer element 502 overlying a first portion 504 of the surface region of the first substrate member in a vicinity of a first edge region of the first substrate member as shown in FIG. 5. The method also provides a second spacer element 506 overlying a second portion 508 of the surface region of the first substrate member in a vicinity of a second edge region of the first substrate member, also shown in FIG. 5. The first spacer element and the second spacer element is characterized by a second thickness 510. The second thickness can range from about three mils to about six mils in a specific embodiment. In a preferred embodiment, the first spacer element and the second spacer element may be provided using printed circuit boards. Depending upon the embodiments, only one of the printed circuit boards can have electrical components thereon. The other printed circuit board can be a base board functioning just as a spacer element. In a preferred embodiment, the second thickness is greater than a combined total thickness of the thin film photovoltaic cell and the connector member. Of course there can be other variations, modifications, and alternatives.

Figure 6:
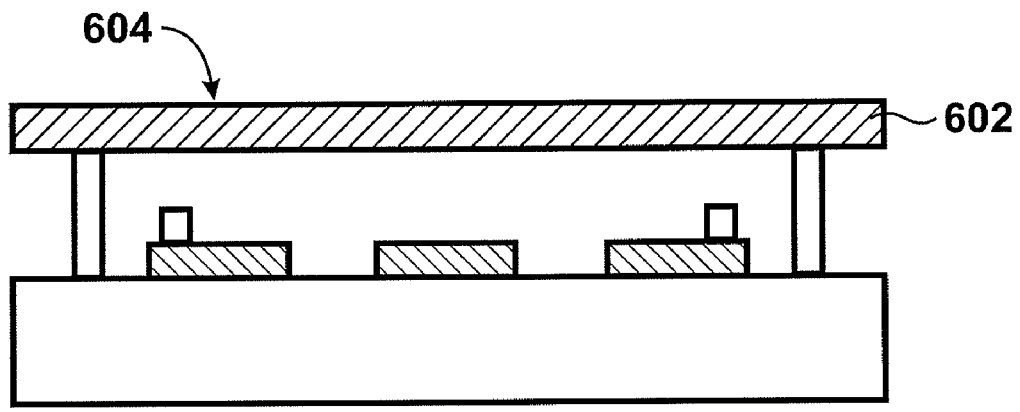

Referring to FIG. 6, the method for packaging a solar module includes providing a laminating material 602 having a surface region 604 overlying the upper region of the first connector member, the second connector member, the first spacer element, the second spacer element, and exposed regions of the plurality of thin film photovoltaic cells. The laminating material can be a polymeric material such as ethyl vinyl acetate, commonly known as EVA in a specific embodiment. Other material can also be used, depending on the application. One skilled in the art would recognize other variations, modifications, and alternatives.

Figure 7:
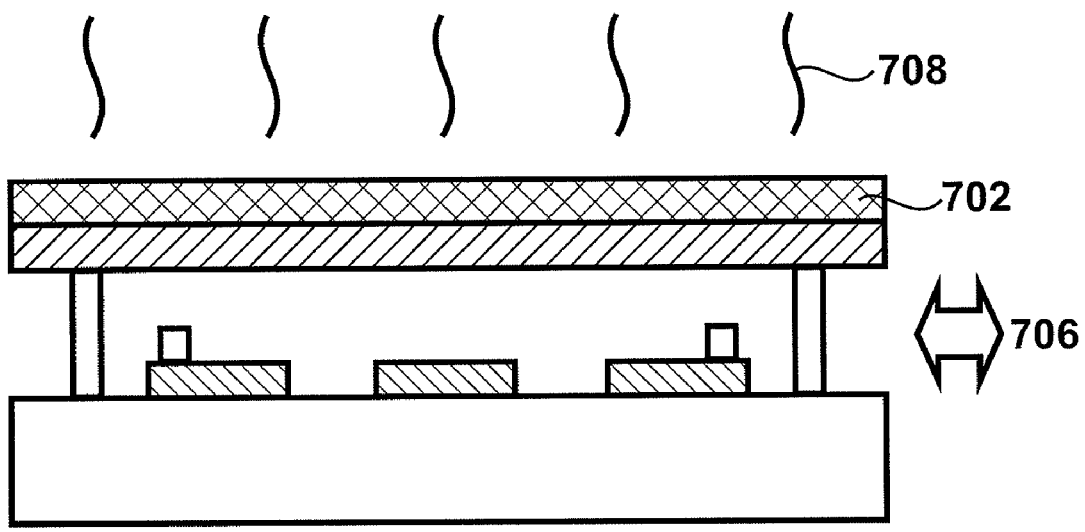

In a specific embodiment, the method includes overlying a second substrate member 702 on the surface region of the laminating material as shown in FIG. 7. The method then subjects the first substrate member, the second substrate member, and the laminating material to a laminating process 706 to form a solar cell module. In a specific embodiment, the laminating process includes a thermal process 708 to cause fluidity of the laminating material. The thermal process is provided at a temperature ranging from 60 Degree Celsius to about 240 Degree Celsius for EVA as laminating material. In an alternative embodiment, the thermal process is provided at a temperature ranging from about 80 Degree Celsius to about 150 Degree Celsius. Preferably, the laminating process allows for planarity of the first substrate member and the second substrate member for the solar cell module.

In a specific embodiment, the thermal process provides an activation process for semiconductor thin film materials for the photovoltaic cells. The semiconductor thin film materials can include semiconductor metal chalcogenide material such as semiconductor metal oxides, semiconductor metal sulfides, semiconductor metal selenides, or semiconductor metal tellurides, among others. Of course there can be other variations, modifications, and alternatives.

Figure 8:
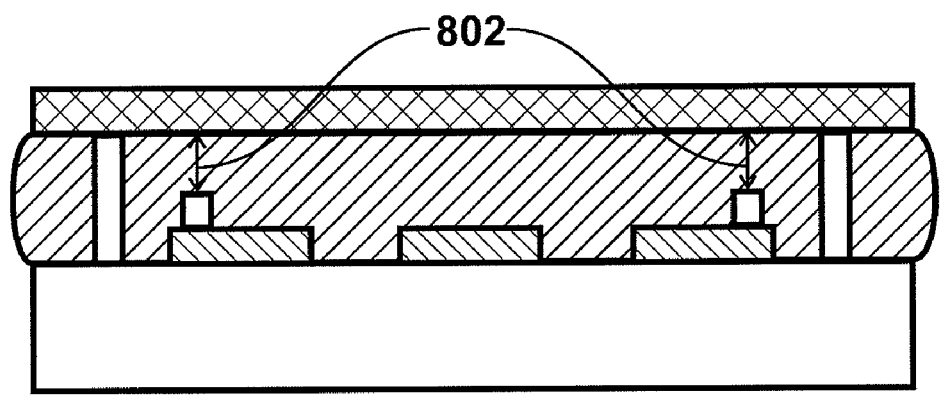

Referring to FIG. 8, a spatial gap 802 is maintained in a region between the upper region of the connector member and the second substrate member during the lamination process using the spacer element. In a specific embodiment, the spatial gap is filled by the laminating material and prevents the connector element such as the ribbon connector from cracking during the lamination process. The spatial gap ranges from about 0.8 mil to about 1.1 mil in a specific embodiment. Of course there can be other variations, modifications, and alternatives.

Figure 9:
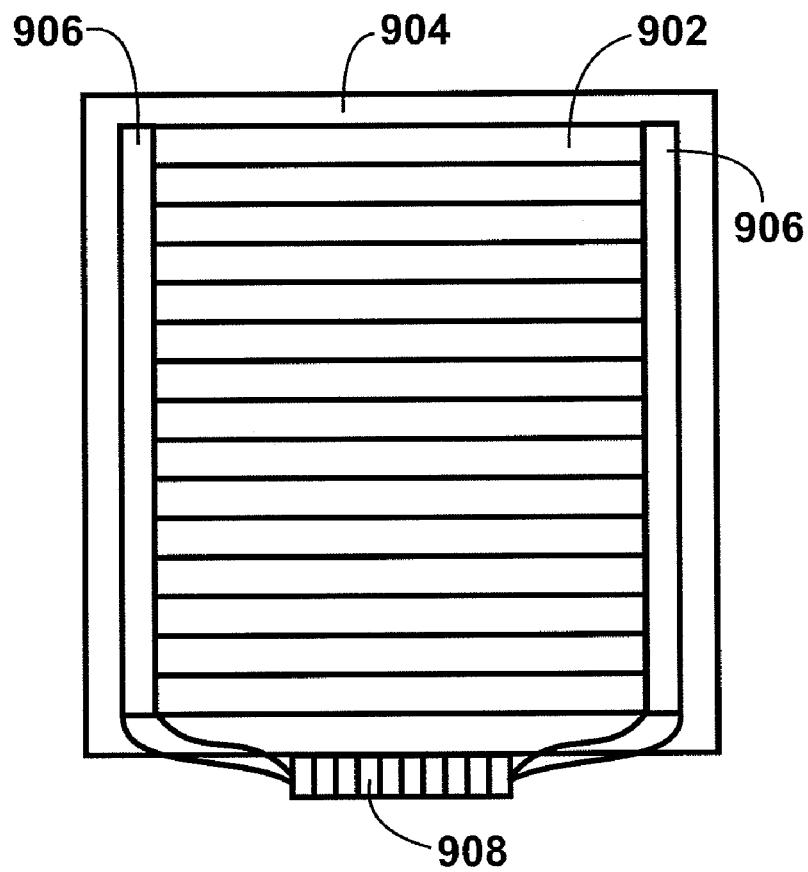

FIG. 9 is a top view diagram of a solar cell module 900 according to an embodiment of the present invention. This diagram is merely an example which should not unduly limit the scope of the claims herein. One skilled in the art would recognize other variations, modifications, and alternatives. As shown, the solar cell module includes a plurality of photovoltaic cells 902 overlying a first substrate member 904. The solar cell module also includes connector members 906, which electrically coupled the plurality of thin film photovoltaic cells to a junction box 908.

It is also understood that the examples and embodiments described herein are for illustrative purposes only and that various modifications or changes in light thereof will be suggested to persons skilled in the art. For example, embodiments according to the present invention uses EVA as the laminating material, other suitable laminating material may also be used. It is also understood that the present invention can be extended to other photovoltaic materials, for example, silicon based photovoltaic cells and other thin film photovoltaic cells. Various modifications and changes are to be included within the spirit and purview of this application and scope of the appended claims.

What is claimed is:

1. A method for packaging solar cell module, the method comprises:
   providing a first substrate member having a surface region;
   forming a plurality of thin film photovoltaic cells overlying the surface region of the first substrate member, each of the thin film photovoltaic cell having a first thickness, a first width, and a first length;
   operably coupling a first connector member and a second connector member to each of the plurality of thin film photovoltaic cells, the first connector member and the second connector member having an upper surface region and a second thickness;
   providing a first spacer element overlying a first portion of the surface region of the first substrate member, a second spacer element overlying a second portion of the surface region of the first substrate member, the first spacer element and the second spacer element having a third thickness;
   providing a laminating material overlying the plurality of thin film photovoltaic cells, the first spacer element, the second spacer element, the first connector member, the second connector member, and exposed regions of the first substrate member;
   coupling a second substrate member overlying the laminating material;
   processing the first substrate member, the laminating material, and the second substrate member using a lamination process to form a photovoltaic module; and
   maintaining a spatial gap occupied by a portion of the laminating material between the upper surface region and the second substrate member, using the first spacer element and the second spacer element to maintain planarity between the first substrate member and the second substrate member during the lamination process.

2. The method of claim 1 further comprises an ultraviolet curing process to cure the laminating material.

3. The method of claim 1 wherein the third thickness is greater than a total thickness of the first thickness and the second thickness.

4. The method of claim 1 wherein the first spacer element and the second spacer element are provided using printed circuit boards.

5. The method of claim 4 further comprises coupling one of the first printed circuit board and the second printed circuit board to a junction box.

6. The method of claim 1 wherein the plurality of thin film photovoltaic cells are fabricated using semiconductor metal chalcogenide material such as semiconductor metal oxides, semiconductor metal sulfides, semiconductor metal selenides, or semiconductor metal tellurides.

7. The method of claim 1 wherein the plurality of thin film photovoltaic cells are fabricated using semiconductor material comprising Group IV species.

8. The method of claim 1 wherein the first substrate member and the second substrate member are transparent substrate such as glass, quartz, fused silica, and others.

9. The method of claim 1 wherein the first connector member and the second connector member are ribbon connectors.

10. The method of claim 1 wherein the spatial gap prevents the first connector member and the second connector member, and/or the second substrate member from cracking during the laminating process.

11. The method of claim 1 wherein the connector member has a thickness of about three mils to about six mils.

12. The method of claim 1 wherein the spatial gap has a thickness of about one mil.

13. The method of claim 1 wherein the laminating material is ethyl vinyl acetate (EVA).

14. The method of claim 1 wherein the lamination process comprises:
    joining the second substrate member to the first substrate using the laminating material overlying the first substrate member;
    clamping the second substrate member to the first substrate member; and
    providing a thermal process to couple the second substrate member to the first substrate member.

15. The method of claim 14 wherein the thermal process is provided at a temperature ranging from about 60 Degree Celsius to about 240 Degree Celsius.

16. The method of claim 14 wherein the thermal process is provided at a temperature ranging from about 80 Degree Celsius to about 150 Degree Celsius.

17. The method of claim 14 wherein the thermal process is provided in a time duration ranging about 20 minutes to about 40 minutes.

18. The method of claim 14 wherein the thermal process activates one or more of the semiconductor metal chalcogenide thin film materials for the plurality of thin film photovoltaic cells in a controlled environment and improves carrier lifetime characteristics for the one or more of the semiconductor metal chalcogenide thin film materials.

19. The method of claim 18 wherein the controlled environment can be provided using nitrogen, an inert gas, or a vacuum.

* * * * *